(12) United States Patent
Chapelon et al.

(10) Patent No.: US 8,980,738 B2
(45) Date of Patent: Mar. 17, 2015

(54) INTEGRATED CIRCUIT CHIP AND FABRICATION METHOD

(75) Inventors: Laurent-Luc Chapelon, Domene (FR); Julien Cuzzocrea, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 352 days.

(21) Appl. No.: 13/323,902

(22) Filed: Dec. 13, 2011

(65) Prior Publication Data
US 2012/0171877 A1    Jul. 5, 2012

(30) Foreign Application Priority Data

Dec. 30, 2010  (FR) ..................... 10 61356

(51) Int. Cl.
*H01L 21/44* (2006.01)
*H01L 29/40* (2006.01)
(Continued)

(52) U.S. Cl.
CPC ........ *H01L 21/76898* (2013.01); *H01L 23/481* (2013.01); *H01L 24/03* (2013.01); *H01L 24/05* (2013.01); *H01L 24/11* (2013.01); *H01L 24/13* (2013.01); *H01L 2224/1147* (2013.01); *H01L 2224/13111* (2013.01); *H01L 2224/13147* (2013.01); *H01L 2224/13565* (2013.01); *H01L 2224/1357* (2013.01); *H01L 2224/13657* (2013.01); *H01L 2924/01029* (2013.01); *H01L 2924/01047* (2013.01); *H01L 2924/01058* (2013.01); *H01L 2924/01073* (2013.01); *H01L2924/01079* (2013.01); *H01L 2924/014* (2013.01);
(Continued)

(58) Field of Classification Search
CPC ......... H01L 23/52; H01L 21/60; H01L 21/76; H01L 21/768; H01L 23/498; H01L 23/48
USPC ........... 438/69, 621, 109, 455, 462, 613, 459, 438/637, 107, 612; 257/621, 758, 531, 257/770–786
See application file for complete search history.

(56) References Cited

U.S. PATENT DOCUMENTS

| 7,646,100 | B2 | 1/2010 | Kameyama et al. |
| 8,492,263 | B2 | 7/2013 | Wang et al. |

(Continued)

FOREIGN PATENT DOCUMENTS

| EP | 1482553 A2 | 12/2004 |
| EP | 1482553 A2 * | 12/2004 |

(Continued)

OTHER PUBLICATIONS

French Search Report and Written Opinion for FR 1061356 dated Aug. 16, 2011 (10 pages).

*Primary Examiner* — Amar Movva
*Assistant Examiner* — Sheikh Maruf
(74) *Attorney, Agent, or Firm* — Gardere Wynne Sewell LLP

(57) ABSTRACT

An electrical connection structure for an integrated circuit chip includes a through via provided in a opening and a laterally adjacent void that are formed in a rear face of a substrate die. A front face of the substrate die includes integrated circuits and a layer incorporating a front electrical interconnect network. The via extends through the substrate die to reach a connection portion of the front electrical interconnect network. An electrical connection pillar made of an electrically conductive material is formed on a rear part of the electrical connection via above the void. A local external protection layer may at least partly cover the electrical connection via and the electrical connection pillar.

17 Claims, 7 Drawing Sheets

(51) Int. Cl.
*H01L 23/52* (2006.01)
*H01L 23/48* (2006.01)
*H01L 21/768* (2006.01)
*H01L 23/00* (2006.01)

(52) U.S. Cl.
CPC ............... *H01L 2924/01033* (2013.01); *H01L 2924/0105* (2013.01); *H01L 2924/01074* (2013.01); *H01L 2224/0556* (2013.01); *H01L 2224/05099* (2013.01); *H01L 2224/0502* (2013.01); *H01L 2224/05599* (2013.01); *H01L 2224/0501* (2013.01); *H01L 2224/0401* (2013.01); *H01L 2224/05548* (2013.01); *H01L 2224/05556* (2013.01); *H01L 2224/05571* (2013.01)
USPC .......................... 438/612; 257/779; 257/786

(56) References Cited

U.S. PATENT DOCUMENTS

| | | |
|---|---|---|
| 2001/0032783 A1 | 10/2001 | Gopalraja et al. |
| 2010/0078770 A1* | 4/2010 | Purushothaman et al. ... 257/621 |
| 2010/0182040 A1* | 7/2010 | Feng et al. ...................... 326/38 |
| 2010/0246152 A1* | 9/2010 | Lin et al. ........................ 361/783 |
| 2011/0254160 A1* | 10/2011 | Tsai et al. ...................... 257/738 |
| 2011/0260317 A1 | 10/2011 | Lu et al. |
| 2011/0315526 A1* | 12/2011 | Jahnes et al. .................. 200/181 |

FOREIGN PATENT DOCUMENTS

| | | | |
|---|---|---|---|
| JP | 2005260079 A | | 9/2005 |
| JP | 2005260079 A | * | 9/2005 |

* cited by examiner

INTEGRATED CIRCUIT CHIP AND FABRICATION METHOD

PRIORITY CLAIM

This application claims priority from French Application for Patent No. 1061356 filed Dec. 30, 2010, the disclosure of which is hereby incorporated by reference.

TECHNICAL FIELD

The present invention relates to the field of semiconductor devices and, more particularly, to integrated circuit chips and their fabrication methods.

BACKGROUND

Integrated circuit chips are known that are provided with electrical connection means which comprise electrical connection vias formed in holes passing through the substrate, on a front face of which the integrated circuits are formed, in order to produce electrical connections on the rear, that is to say opposite the side where the integrated circuits are situated, these electrical connection vias being provided with rear electrical connection pillars. The rear face of the substrate and the vias are covered with a permanent passivation layer made of a photosensitive polymer, through which the rear electrical connection pillars are formed by using non-permanent conductive layers on this passivation layer. Consequently, the fabrication methods implemented comprise a large number of steps in particular because of the existence of the passivation layer. Furthermore, the passivation layer cannot completely fill the central hole remaining in the vias even though there is a risk of internal oxidation of the electrical connection vias.

SUMMARY

According to one implementation, a fabrication method is proposed which at least partly avoids the abovementioned drawbacks.

There is proposed a method for producing an electrical connection means of an integrated circuit chip comprising a substrate die and, on a front face of the substrate, integrated circuits and a layer incorporating a front electrical interconnect network.

The proposed method may comprise: producing at least one local electrical connection via made of an electrically conductive material, through the substrate die and linked to a connection portion of said front electrical interconnect network; producing an electrical connection pillar made of an electrically conductive material, on a rear part of the electrical connection via; and producing a local external protection layer at least partly covering the electrical connection via and the electrical connection pillar.

The proposed method may comprise: producing a through hole through the substrate die via its rear face, revealing a connection portion of said electrical interconnect network and producing a void which is open towards the rear and opens out laterally into the through hole.

The method may comprise: producing, by a physical vapor phase deposition (PVD), a thin layer made of an electrically conductive material, above the rear face of the substrate die and the walls of the through hole and of the void.

The method may comprise: producing, by a local electrochemical deposition with electrical contact on said thin layer, a thick local layer made of an electrically conductive material on the thin layer, in the through hole and the void and above the rear face of the substrate die.

The method may comprise, producing, by a local electrochemical deposition with electrical contact on said thin layer, a rear electrical connection pillar on the thick layer, above the void.

The proposed method may comprise: removing the thin layer around the local thick layer, the remaining portion of the thin layer and the thick layer forming an electrical connection via linked to said front interconnect network and provided with the rear electrical connection pillar.

The method may comprise, before producing the electrical connection pillar: removing a rear part of the thick local layer in such a way that this thick local layer has a rear face in the plane of the rear face of the thin layer, the electrical connection pillar being produced on this rear face of the thick local layer.

The method may comprise: producing, by a selective chemical deposition, a local external protection layer at least partly covering the electrical connection via and the rear electrical connection pillar.

The method may comprise, before producing the thin layer: producing an insulating layer on the rear face of the substrate die and against the walls of the hole and of the void; and removing a part of the insulating layer situated above said connection portion of the front electrical interconnect network.

The method may comprise: producing the insulating layer by a sub-atmospheric chemical vapor phase deposition (SACVD).

The method may comprise a partial etching of the through hole then a complete etching of the hole at the same time as an etching of the void.

According to one embodiment, there is proposed an integrated circuit chip comprising a substrate die and, on a front face of this substrate die, integrated circuits and a layer incorporating a front electrical interconnect network.

A proposed integrated circuit chip may comprise a substrate die and, on a front face of the substrate, integrated circuits and a front layer incorporating a front electrical interconnect network, in which the substrate die has a through hole and a void which is open towards the rear and opens out laterally into the through hole.

The integrated circuit chip may comprise at least one rear electrical connection means comprising an electrical connection via formed in the through hole and the rear void of the substrate die and linked to a connection portion of said front electrical interconnect network, placed facing the through hole and comprising an electrical connection pillar formed on a rear face of the electrical connection via and above the void.

The electrical connection via may be embedded in the through hole and the void of the substrate die.

A local rear protection layer may at least partly cover the electrical connection via and the electrical connection pillar.

The electrical connection via and the electrical connection pillar may comprise copper (Cu) and the protection layer may comprise an alloy of cobalt (Co), tungsten (W) and phosphorous (P).

The pillar may be provided, on its end, with a drop of solder.

BRIEF DESCRIPTION OF THE DRAWINGS

An integrated circuit chip and a method for fabricating integrated circuit chips, according to a particular embodiment of the present invention, will now be described by way of nonlimiting examples, illustrated by the drawing in which.

DETAILED DESCRIPTION OF THE DRAWINGS

Figure 1:
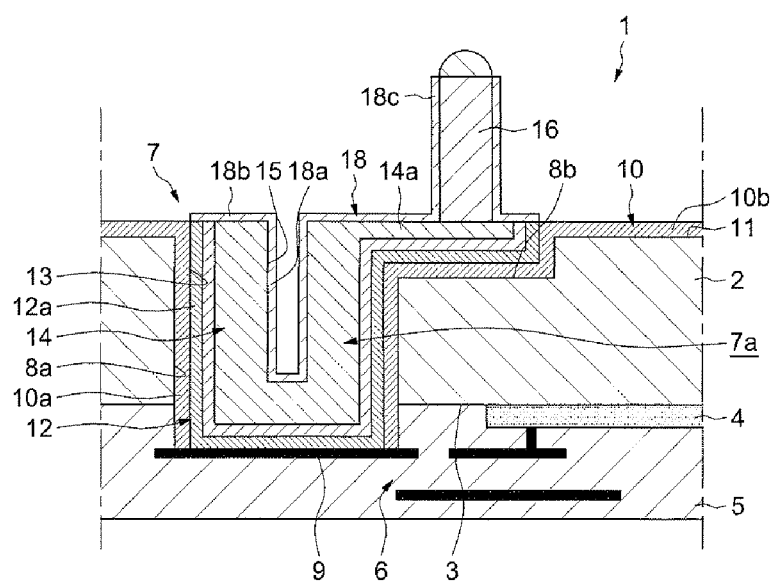
FIG. 1 represents a partial cross section of an integrated circuit chip.

As illustrated in FIG. 1, an integrated circuit chip 1 comprises a substrate die 2, for example made of silicon, on a front face 3 of which are produced integrated circuits 4 and which is provided, on this front face 3, with a front layer 5 in which is incorporated a front electrical interconnect network 6, possibly with several metallic levels, selectively linked to the integrated circuits 4.

The integrated circuit chip 1 comprises a plurality of rear electrical connection means 7, each of which has the following structure.

Through the substrate die 2, and in a region free of integrated circuits 4, a through hole 8a is formed which is prolonged in the front layer 5 to an electrical connection portion 9 of the front interconnect network 6. This connection portion 9 may be situated in the first metallic level of the front interconnect network 6.

In the substrate die 2, there is also formed a void 8b which is open towards the rear and which opens out laterally into the through hole 8a.

An insulating layer 10, for example made of silicon oxide ($SiO_2$), has a part 10a which covers the lateral wall of the through hole 8a, and the lateral wall and the bottom of the void 8b and a part 10b which covers the rear face 11 of the substrate die 2.

A local electrically conductive barrier layer 12, for example made of titanium (Ti), of a bilayer of titanium nitride and titanium (TiN/Ti), of tantalum (Ta) or of a bilayer of tantalum nitride and tantalum (TaN/Ta), covers the part 10a of the insulating layer 10 and the connection portion 9, in the bottom of the hole 8a.

A local electrically conductive attach layer 13, for example made of copper (Cu), covers the barrier layer 12.

The barrier layer 12 and the attach layer 13 have rear edges situated in the plane of the rear face of the part 10b of the insulating layer 10.

A thick electrically conductive local layer 14, for example made of copper (Cu), covers the attach layer 13. The thick local layer 14 has a rear face 14a situated in the plane of the rear face of the part 10b of the insulating layer 10 and determines a remaining central blind hole 15 which is open towards the rear.

An electrically conductive pillar 16, protruding towards the rear, for example made of copper (Cu), is formed on the rear face 14a of the thick layer 14, in the area of the void 8b of the substrate die 2. This pillar may, for example, be cylindrical.

On the end of the protruding pillar 16, a drop of electrically conductive solder 17 is formed, for example made of an alloy of tin and silver (SnAg) or an alloy of tin, silver and copper (SnAgCu).

Finally, an external local rear protection layer 18, for example made of an alloy of cobalt, tungsten and phosphorus (CoWP), comprises a part 18a which covers the walls of the remaining hole 15 of the thick layer 14, comprises a part 18b which covers the rear face 14a of the thick layer 14 and the abovementioned edges of the layers 12 and 13, by extending to the part 10b of the insulating layer 10, and comprises a part 18c which covers the peripheral face of the protruding pillar 16 and, possibly, the drop of solder 17.

According to a variant embodiment, the thickness of the thick local layer 14 may be sufficient to completely fill the rest of the hole 8a and thus eliminate the central blind hole 15.

Thus, each rear electrical connection means 7 comprises an electrical connection via 7a formed by the local layers 12, 13 and 14 and comprises the protruding pillar 16, the end of which can be soldered to another electronic component via the drop of solder 17, this via 7a and this pillar 16 being protected against corrosion by virtue of the existence of the external protection layer 18.

The rear edges of the barrier layer 12 and of the attach layer 13 and the rear face 14a of the thick local layer 14 being situated in the plane of the rear face of the part 10b of the insulating layer 10, the result of this is that the electrical connection via 7a is embedded in the hole 8a and the void 8b.

With reference to FIGS. 2 to 12, there now follows a description of a method for collectively fabricating a plurality of integrated circuit chips corresponding to the integrated circuit chip 1 of FIG. 1.

Figure 2:
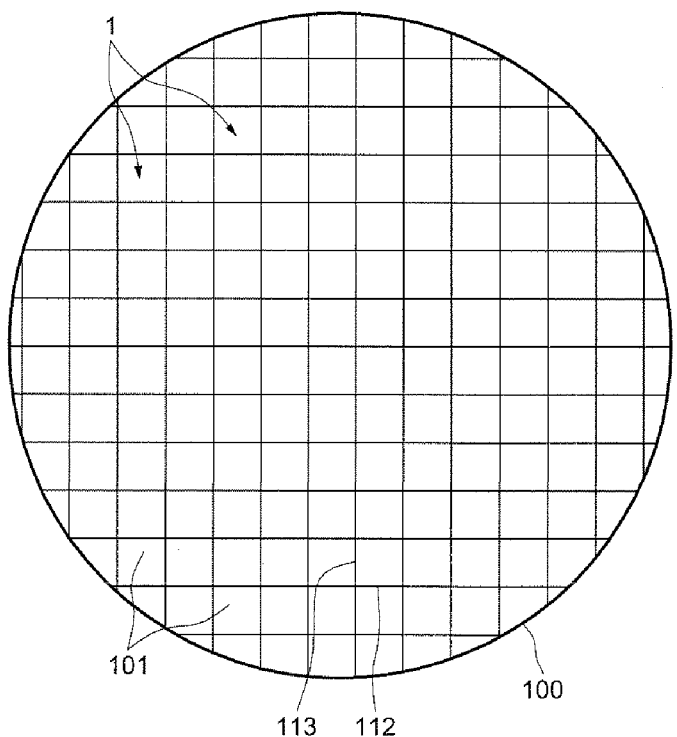
FIG. 2 represents a wafer of integrated circuit chips.

As illustrated in FIG. 2, there is, for this, a wafer 100, for example made of silicon, having a plurality or matrix of placements 101 each corresponding to an integrated circuit chip 1 to be fabricated.

Figure 3:
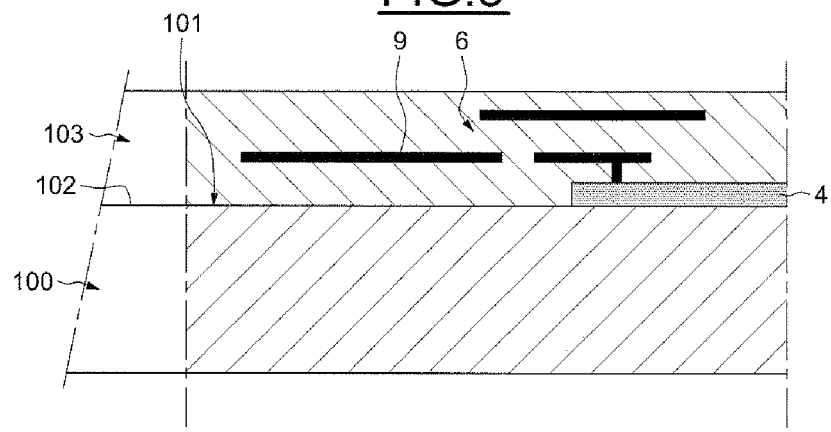
FIGS. 3, 4a, 4b and 6 to 12 represent steps in fabricating integrated circuit chips, seen in cross section.

As illustrated in FIG. 3, integrated circuits 4 and front electrical connection networks 6 are produced in a common front layer 103, on a front face 102 of the wafer 100 and respectively in the placements 101.

Next, pluralities of through holes 8a and voids 8b of the chips to be fabricated are produced by etching, via the rear face 104 of the wafer 100 and respectively in the placements 101, as follows.

Figure 4A:
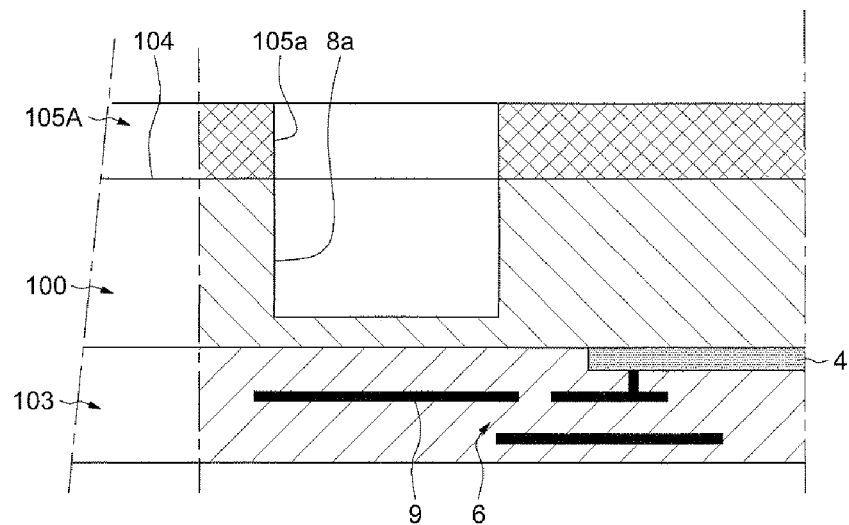

As illustrated in FIG. 4A, a mask 105A is formed on the rear face 104 of the substrate die 100, in which are formed through passages 105a corresponding to the section of the holes 8a, and a first partial etching of the holes 8a through these through passages 105a is performed, to a limited depth. Then, the mask 105A is removed.

Figure 4B:
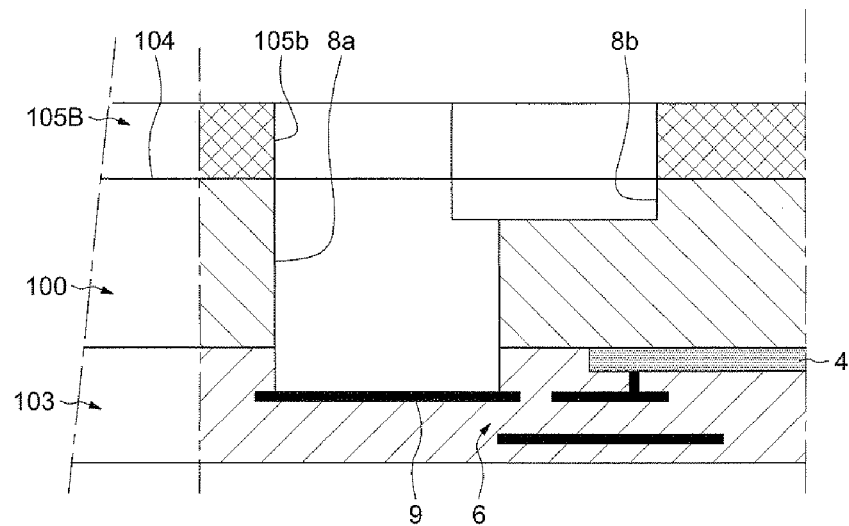

Next, as illustrated in FIG. 4B, a mask 105B is formed on the rear face 104 of the substrate die 100, in which are formed through passages 105b corresponding to the section of the holes 8a and of the voids 8b and a second etching is performed through these through passages 105b, so that the holes 8a are completely formed as far as the portions 9 of the electrical connection networks and so that the voids 8b are formed at the same time. Then, the mask 105B is removed.

Figure 5:
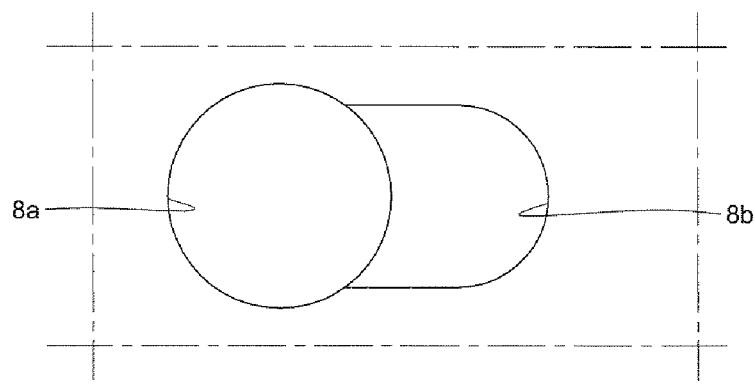
FIG. 5 represents a plan view of FIG. 4.

According to an exemplary embodiment illustrated in particular in FIG. 5, each through hole 8a can be cylindrical and each void 8b can have a flat bottom and a lateral wall comprising a semicylindrical part opposite the through hole 8a, this semicylindrical part joining the through hole 8a via two opposite and parallel flat surfaces. The through passages 105 formed in the mask 105 may have corresponding edges.

Figure 6:
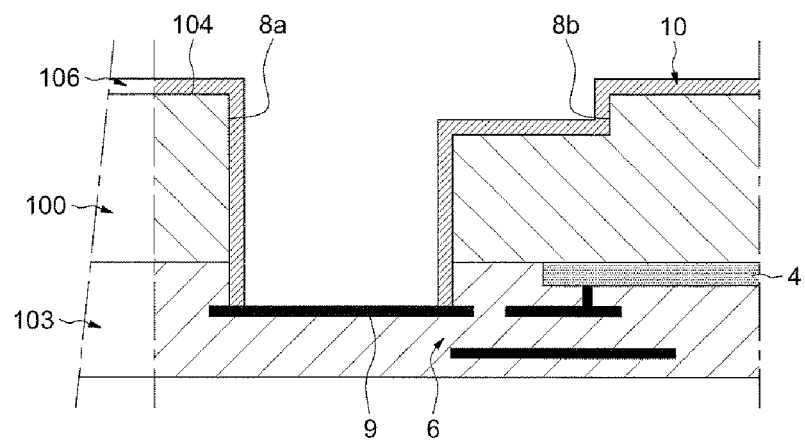

Next, as illustrated in FIG. 6, an insulating layer 106 is produced by sub-atmospheric chemical vapor phase deposition (SACVD), on the rear face 104 and in the holes 8a and the voids 8b of the wafer 100, and the parts of this layer 106 in the bottom of the holes 8 are removed so as to reveal the portions 9 of the front electrical connection networks 6. The insulating layer 10 is thus obtained in each of the placements 101 and for each chip to be fabricated.

According to a variant embodiment, it will be possible to produce the holes 8 up to close to the portions 9 of the electrical connection networks 6, in the layer 103, then deposit the insulating layer 106, then remove the parts of this layer 106 in the bottom of the holes 8 and remove the rest of the layer 103 to reveal the portions 9 of the front electrical connection networks 6.

Figure 7:
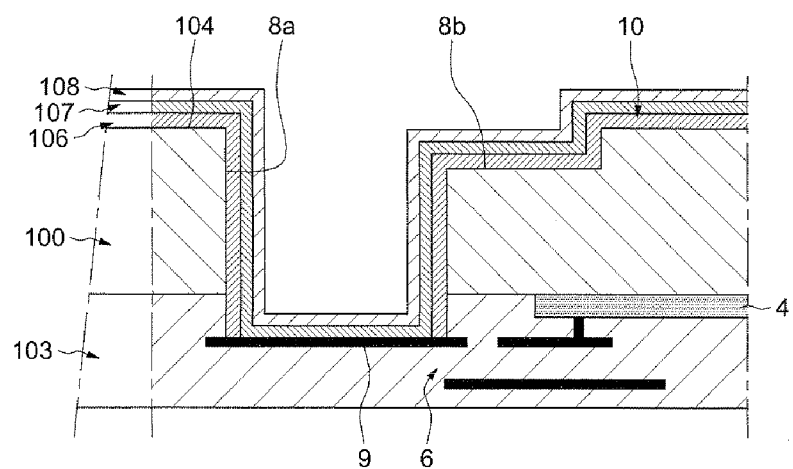

Next, as illustrated in FIG. 7, a layer 107 is produced by a physical vapor phase deposition (PVD), on the insulating layer 106 and in the bottom of the through holes 8b and of the voids 8b, followed by a layer 108 on this layer 107, both intended for the fabrication of the layer 12 then of the layer 13 of the chips to be fabricated.

Figure 8:
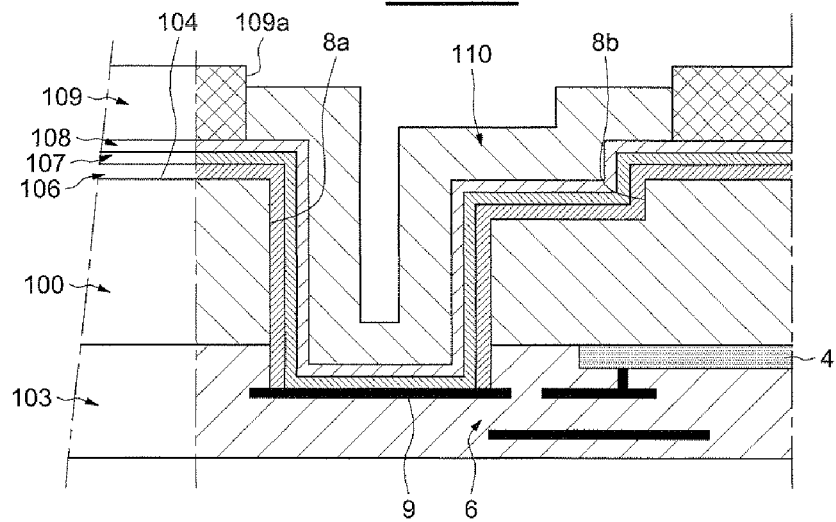

Next, as illustrated in FIG. 8, a mask 109 is formed on the layer 108, through which are formed openings 109a, the edges of which surround, at a distance, areas corresponding to the edges of the holes 8a and of the associated voids 8b of the chips to be fabricated. Then, an electrochemical deposition in a bath is used to produce thick local layers 110 in the openings 109a of the mask 109, by taking the electrical contact on the peripheral edge of the layer 108, at the periphery of the wafer 100. These thick local layers 110 are intended for the fabrication of the local layers 14 of the chips to be fabricated.

Figure 9:
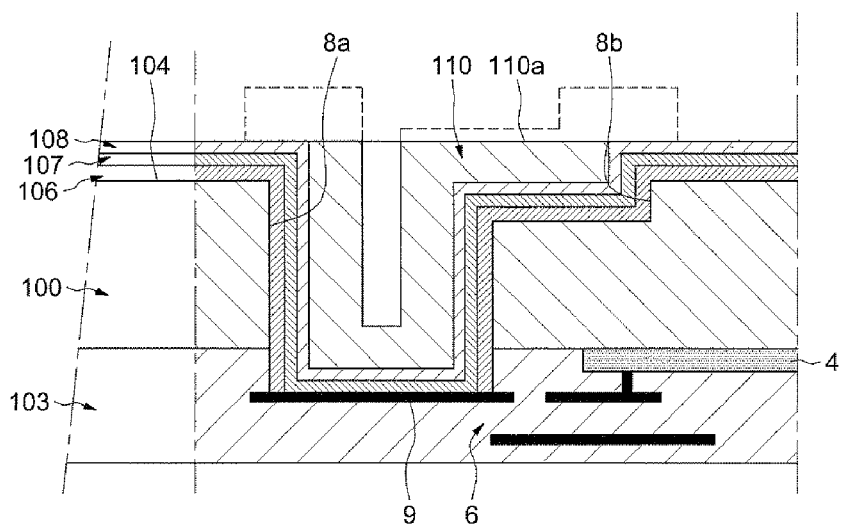

Next, as illustrated in FIG. 9, after having removed the mask 109, the rear parts of the local layers 110 are trimmed by a chemical-mechanical polishing (CMP) operation, so that they have rear faces 110a situated in plane of the rear face of the layer 108.

Figure 10:
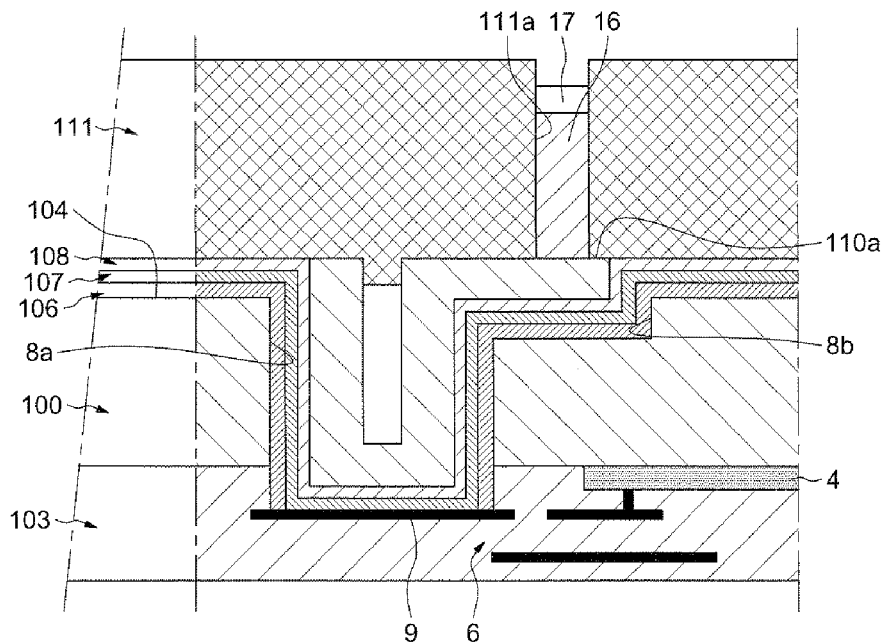

Next, as illustrated in FIG. 10, a mask 111 is formed on the layer 108 and on the rear faces 110a of the local layers 110, by forming, through this mask 111, through openings 111a corresponding to the pillars 16 of the chips to be fabricated.

Then, an electrochemical deposition in a bath is used to produce the pillars 16 then the drops of solder 17 in the openings 111a of the mask 111, by taking, as previously, the electrical contact on the peripheral edge of the layer 108, at the periphery of the wafer 100.

Figure 11:
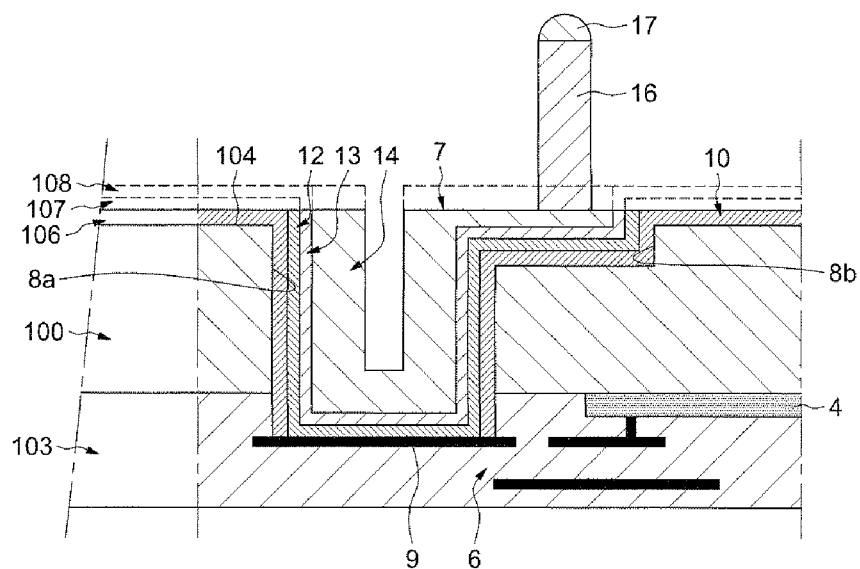

Next, as illustrated in FIG. 11, after having removed the mask 111, a wet etching is performed in suitable baths to remove the parts of the layer 108 then of the previous layer 107, situated on the insulating layer 106 and above the whole rear face 104 of the wafer 100, and, possibly, to remove a rear portion of the surface of the local layers 110, around the pillars 16. Local layers 12, 13 and 14 are then obtained which are associated with each of the through holes 8 and of the voids 8b of the chips to be produced.

Then, a bake is performed so that the drops of solder 17 take the form of domes.

Thus, pluralities of rear local electrical connection means 7 are formed, in the placements 101 of the wafer 100, each comprising a through electrical connection via 7a and a protruding pillar 16 provided with a drop of solder 17.

Figure 12:
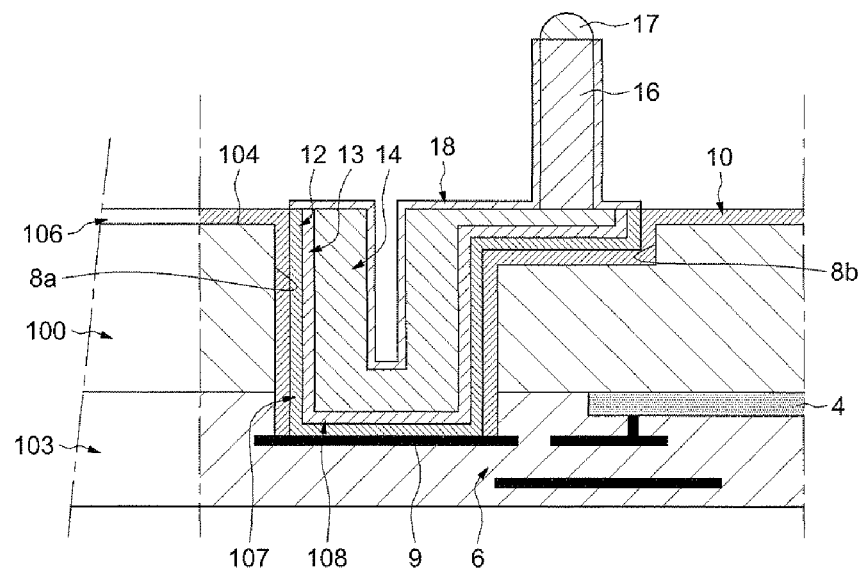

Next, as illustrated in FIG. 12, a naturally selective chemical deposition is performed to produce protection layers 18 on the rear electrical connection means 7. For example, if the thick layer 14 and the protruding pillar 16 are made of copper, the protection layer 18 may be formed by a selective chemical deposition of a ternary alloy based on cobalt, tungsten and phosphorus (CoWP) using an auto-catalytic vapor phase growth method.

Next, as illustrated in FIG. 2, the integrated circuit chips 1 obtained in the placements 101 are singularized, for example by sawing along lines 112 and columns 113 separating these placements 101.

The present invention is not limited to the examples described above. Many other variant embodiments are possible, without departing from the framework defined by the appended claims.

What is claimed is:

1. A method, comprising:
producing at least one electrical connection via made of an electrically conductive material passing through a semiconductor substrate die and linked to a connection portion of a front electrical interconnect network in a layer on a front face of the semiconductor substrate die, wherein producing said electrical connection via comprises embedding the electrically conductive material in both a through hole extending through the semiconductor substrate die and a rear void extending into the semiconductor substrate die adjacent to the through hole, wherein the rear void is open out vertically only towards a rear face of the semiconductor substrate die and is further open out laterally into the through hole;
producing an electrical connection pillar made of an electrically conductive material placed on a rear part of the electrical connection via and positioned vertically aligned over the rear void; and
producing an external protection layer at least partly covering the electrical connection via and the electrical connection pillar.

2. The method according to claim 1, wherein the electrically conductive material is copper and the external protection layer is an alloy of cobalt (Co), tungsten (W) and phosphorous (P).

3. The method according to claim 1, wherein producing said electrical connection via comprises:
producing said through hole extending through the semiconductor substrate die via the rear face of the semiconductor substrate die;
producing said void in the semiconductor substrate which is open out vertically only towards the rear face and is further open out laterally into the through hole; and
filling the hole and void with the electrically conductive material which is insulated from the semiconductor substrate die.

4. The method according to claim 3, wherein producing the electrical connection pillar comprises forming the electrical connection pillar at a location vertically aligned over the void which is filled with the electrically conductive material.

5. The method according to claim 4, wherein producing the local external protection layer at least partly covering the electrical connection via and the rear electrical connection pillar comprises performing selective chemical deposition of the protection layer.

6. The method according to claim 5, wherein the electrically conductive material is copper and the external protection layer is an alloy of cobalt (Co), tungsten (W) and phosphorous (P).

7. A method, comprising:
producing a through hole extending through a semiconductor substrate die via a rear face to reveal a connection portion of a front electrical interconnect network formed in a layer on a front face of the semiconductor substrate die;
producing a void in the rear face of the semiconductor substrate die adjacent to the through hole which is open out vertically only towards the rear face and is further open out laterally into the through hole;
producing, by a physical vapor phase deposition, a thin layer made of an electrically conductive material on the rear face of the semiconductor substrate die and on the walls of the through hole and on walls of the void and on a floor of the void;
producing, by a local electrochemical deposition with electrical contact on said thin layer, a thick layer made of an electrically conductive material on the thin layer, in the through hole and in the void and above the rear face of the semiconductor substrate die;

producing, by a local electrochemical deposition with electrical contact on said thin layer, a rear electrical connection pillar on the thick layer vertically aligned above the floor of the void; and removing a portion of the thin layer and the thick layer, a remaining portion of the thin layer and the thick layer after said removing forming an embedded electrical connection via linked to said front interconnect network and provided with the rear electrical connection pillar.

8. The method according to claim 7, further comprising, before producing the electrical connection pillar:

removing a rear part of the thick layer in such a way that this thick layer has a rear face in a plane of the rear face of the thin layer, the electrical connection pillar being produced on this rear face of the thick layer.

9. The method according to claim 7, further comprising:

producing, by a selective chemical deposition, an external protection layer at least partly covering the electrical connection via and the rear electrical connection pillar.

10. The method according to claim 9, wherein the electrically conductive material is copper and the external protection layer is an alloy of cobalt (Co), tungsten (W) and phosphorous (P).

11. The method according to claim 7, further comprising, before producing the thin layer:

producing an insulating layer on the rear face of the substrate die and against the walls of the through hole and of the void; and removing a part of the insulating layer situated above said connection portion of the front electrical interconnect network.

12. The method according to claim 11, wherein producing the insulating layer comprises performing a sub-atmospheric chemical vapor phase deposition (SACVD).

13. The method according to claim 7, wherein producing the through hole comprises performing a partial etching of the through hole and wherein producing the void comprises performing a complete etching of the through hole at the same time as an etching of the void.

14. An integrated circuit chip, comprising:

a semiconductor substrate die;

integrated circuits on a front face of the semiconductor substrate die;

a front layer incorporating a front electrical interconnect network on the front face of the semiconductor substrate die;

a through hole extending into a rear face of the semiconductor substrate die;

a void adjacent to the through hole also extending into the rear face of the semiconductor substrate die, wherein the void is open out vertically only towards the rear face and open out laterally into the through hole; and at least one rear electrical connection structure comprising:

an electrical connection via in the through hole and in the void of the semiconductor substrate die and linked to a connection portion of said front electrical interconnect network; and an electrical connection pillar on a rear face of the electrical connection via at a position vertically aligned above the void.

15. The chip according to claim 14, comprising a rear protection layer at least partly covering the electrical connection via and the electrical connection pillar.

16. The chip according to claim 15, wherein the electrical connection via and the electrical connection pillar comprise copper (Cu) and the rear protection layer comprises an alloy of cobalt (Co), tungsten (W) and phosphorous (P).

17. The chip according to claim 14, further including a drop of solder on an end of the pillar.

* * * * *